United States Patent
Lee et al.

(10) Patent No.: US 7,257,028 B2
(45) Date of Patent: Aug. 14, 2007

(54) TEMPERATURE COMPENSATED BIT-LINE PRECHARGE

(75) Inventors: Kyeong-Han Lee, Gyeonggi-do (KR); Sung-Soo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/884,152

(22) Filed: Jul. 1, 2004

(65) Prior Publication Data

US 2005/0036369 A1    Feb. 17, 2005

(30) Foreign Application Priority Data

Aug. 13, 2003  (KR) .............. 10-2003-0056164

(51) Int. Cl.
*G11C 16/04*  (2006.01)
*G11C 7/00*   (2006.01)

(52) U.S. Cl. .............. 365/185.18; 365/185.25; 365/203; 365/211

(58) Field of Classification Search ........... 365/185.09, 365/185.17, 185.18, 185.21, 185.29, 185.33, 365/185.05, 185.25, 203, 211; 323/281
See application file for complete search history.

(56) References Cited

U.S. PATENT DOCUMENTS

| | | | | |
|---|---|---|---|---|
| 5,392,236 A | * | 2/1995 | Hashimoto | 365/185.33 |
| 5,768,188 A | * | 6/1998 | Park et al. | 365/185.17 |
| 6,031,760 A | * | 2/2000 | Sakui et al. | 365/185.21 |
| 6,067,248 A | * | 5/2000 | Yoo | 365/185.09 |
| 6,084,387 A | * | 7/2000 | Kaneko et al. | 323/281 |
| 6,269,026 B1 | * | 7/2001 | Venkatesh et al. | 365/185.29 |
| 6,674,668 B2 | * | 1/2004 | Ikehashi et al. | 365/185.18 |
| 6,678,191 B2 | * | 1/2004 | Lee et al. | 365/185.17 |
| 6,898,108 B2 | * | 5/2005 | Kato et al. | 365/203 |

* cited by examiner

*Primary Examiner*—Trong Phan
(74) *Attorney, Agent, or Firm*—Marger Johnson & McCollom, P.C.

(57) ABSTRACT

A nonvolatile semiconductor memory device compensates for temperature changes by holding constant a bit line precharge level. A memory device according to the present invention may include an electrically programmable memory cell array connected to a plurality of word lines and a plurality of bit lines, a bit line voltage supplying circuit for supplying a bit line voltage to the bit lines, a shut-off circuit connecting the memory cell array and the bit line voltage supplying circuit, and a shut-off controlling circuit for controlling the shut off circuit. The shut-off controlling circuit may be constructed to compensate for temperature changes in order to hold the bit-line precharge level constant.

19 Claims, 7 Drawing Sheets

| SSL | Vread |
|---|---|
| WL(Selection) | 0V |
| WL(Non-selection) | Vread |
| GSL | Vread |
| CSL | 0V |

TEMPERATURE COMPENSATED BIT-LINE PRECHARGE

CROSS REFERENCE TO RELATED APPLICATIONS

This application claims priority from Korean Patent Application No. 2003-56164, filed on Aug. 13, 2003, the contents of which are incorporated herein by reference in their entirety.

BACKGROUND

1. Field of the Invention

The present invention relates to a nonvolatile semiconductor memory device, and more particularly, to a nonvolatile semiconductor memory device capable of compensating for a change of a bit-line precharge level due to temperature change.

2. Description of the Related Art

In A nonvolatile semiconductor memory device, word lines and bit lines are arranged in a matrix of rows and columns, respectively, and memory cells are positioned at the intersections of these rows and columns. The word line is selected by a row address, and the bit line is selected by a column address. Data in the memory cell at a selected position is read through an input and output circuit.

As an example of a nonvolatile semiconductor memory device, a NAND flash memory device has a basic structure consisting of a string of a plurality of memory cells connected to a bit line, and a block of which a plurality of these strings share one contact.

The nonvolatile semiconductor memory device is configured to include a memory cell array, a page buffer and the like. The memory cell array is comprised of the blocks having a plurality of strings as a basic unit. Each string includes a plurality of memory cells serially connected. Each of the memory cells has a floating gate and a control gate, and electrically performs program and erase operations by accumulating electrons in the floating gate or discharging the accumulated electrons, respectively. A memory cell with accumulated electrons in its floating gate is called a "programmed cell", and a memory cell from which electrons are discharged from its floating gate is called an "erased cell".

The program and erase operations of the nonvolatile semiconductor memory device use an F-N tunneling phenomenon. The threshold voltage of a cell transistor depends on whether or not electrons are injected into the floating gate or electrons are discharged from the floating gate. An erased cell acquires a negative threshold voltage (for example, −3V) by discharging electrons from the floating gate to a bulk, a source or a drain. In this instance, the erased cell is called an "on cell". A programmed cell has a positive threshold voltage (for example, +1V) acquired by injecting electrons into the floating gate. At this time, the programmed cell is called an "off cell".

In order to confirm whether or not the memory cell is a programmed cell or an erased cell, a read voltage V read (for example, +4.5V) is applied to non-selected word lines, and 0V is applied to a selected word line. This is called a "reading operation". Before the reading operation is performed, a bit line precharging process needs to occur. When the bit line is precharged, the bit line has a specific precharge level. After the bit line is precharged the reading operation can take place. At this time, if the memory cell connected to the selected word line is an erased cell, the precharge level of the bit line decreases. However, if the memory cell is a programmed cell, the precharge level of the bit line is maintained. Thus, the reading operation determines whether the memory cell is an erased cell or a programmed cell.

To precharge the bit line, a transistor characteristic known as "shut-off" is used, explained as follows. In an NMOS transistor, which includes a drain (D), a source (S), and a gate (G), a power supply voltage (Vcc) is applied to the drain (D). Let the gate-source voltage be expressed as $V_{GS}$, and the gate voltage be expressed as $V_G$. Then the voltage precharged to the source (S) is $V_G-V_{TH}$, being determined by $V_{GS}-V_{TH}$. When $V_{GS}>V_{TH}$, the NMOS transistor is turned-on, and the source (S) is precharged. But if the level of the source (S) is $V_{GS}-V_{TH}$ or more, the NMOS transistor is turned-off. This characteristic of the NMOS transistor is called "shut-off". Accordingly, the bit line has the precharge level determined by $V_{GS}-V_{TH}$ due to the shut-off characteristic of the transistor.

The precharge level $V_G-V_{TH}$ of the bit line is influenced by the threshold voltage of the transistor due to the shut-off characteristic. That is, if the threshold voltage rises, the precharge level of the bit line drops, and if the threshold voltage drops, the precharge level of the bit line rises. The transistor's threshold voltage changes, however, with changing temperature. Generally, the threshold voltage decreases by about 2 mV per 1° C. temperature rise. Accordingly, if the temperature varies, the precharge level of the bit line varies. If the temperature increases then the threshold voltage decreases, causing the precharge level of the bit line to increase. Similarly, if the temperature decreases, then the threshold voltage increases, causing the precharge level of the bit line to decrease. This is a drawback because a memory cell sensed as an on cell at a high temperature may be erroneously sensed as an off cell at a low temperature.

SUMMARY

One aspect of the present invention relates to a nonvolatile semiconductor memory device that compensates for temperature changes by holding a bit line precharge level at a constant value, thereby improving reliability. An embodiment of the present invention includes an electrically programmable memory cell array connected to a plurality of word lines and a plurality of bit lines, a bit line voltage supplying circuit for supplying a bit line voltage to the bit lines, a shut-off circuit connecting the memory cell array and the bit line voltage supplying circuit, and a shut-off controlling circuit for controlling the shut off circuit. An embodiment of a shut-off controlling circuit according to the present invention is constructed to compensate for temperature changes in order to hold constant the bit-line precharge level used to read memory cells.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. However, the present invention is not limited to the embodiments illustrated herein after, and the embodiments herein are rather introduced to provide an easy and complete understanding of the scope and principles of the present invention.

Figure 1:
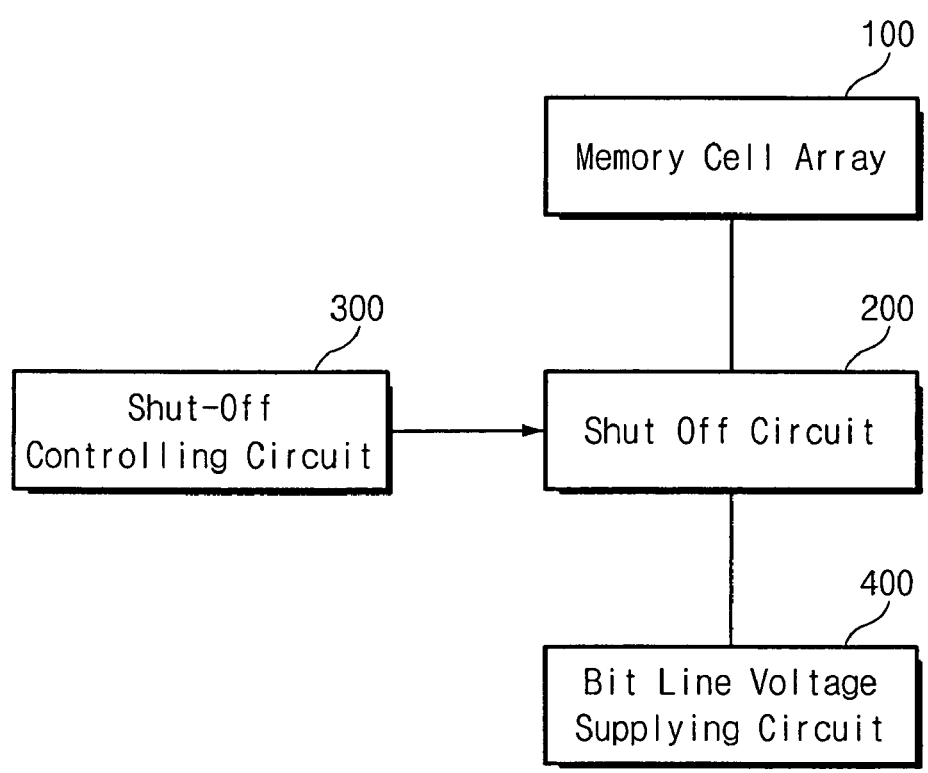
FIG. 1 is a block diagram illustrating a nonvolatile semiconductor memory device according to a preferred embodiment of the present invention.

FIG. 1 is a block diagram illustrating a nonvolatile semiconductor memory device according to a preferred embodiment of the present invention.

To compensate for changes to a bit-line precharge level due to changes of temperature, a nonvolatile semiconductor memory device according to the principles of the present invention includes a memory cell array 100, a shut-off circuit 200, a shut-off controlling circuit 300, and a bit line voltage supplying circuit 400.

The memory cell array 100 is comprised of memory cells for storing data therein, word lines for selecting and activating the memory cells, and bit lines for inputting and outputting data of the memory cell there through.

The bit line voltage supplying circuit 400 supplies a bit line voltage to the bit lines. The bit line voltage used depends on the type of program operation, for example an erase operation.

The shut-off circuit 200 is connected between the memory cell array 100 and the bit line voltage supplying circuit 400 to electrically disconnect or connect them. For example, the shut-off circuit 200 is comprised of an NMOS transistor. The NMOS transistor is comprised of a drain (D), a source (S), and a gate (G). The drain is connected to the bit line voltage supplying circuit 400, the source is connected to the memory cell array 100, and the gate is connected to the shut-off controlling circuit 300.

In the case where the power supply Vcc is applied to the drain (D), a voltage precharged to the source (S) terminal, that is, a voltage precharged to the bit line, is determined by $V_{GS}-V_{TH}$. This is because when $V_{GS} > V_{TH}$, the NMOS transistor is turned-on to precharge the bit line. At this time, if the precharge level of the bit line is $V_G-V_{TH}$ or more, the NMOS transistor is shut off. Accordingly, the shut-off circuit 200 allows the bit line to achieve the precharge level of $V_G-V_{TH}$ as a maximum by the shut-off operation characteristic.

The transistor has a changing threshold voltage as a function of changing temperature. Generally, the threshold voltage of the transistor is reduced by about 2 mV per temperature increased of 1° C. This causes the precharge level of the bit line to change with changing temperature. That is, if the temperature rises, the threshold voltage drops, thereby increasing the bit-line precharge level. Similarly, if the temperature drops, the threshold voltage rises, thereby decreasing the bit-line precharge level. In order to solve the above drawback, the gate-source voltage ($V_{GS}$) may be varied depending on the temperature so as to prevent the bit-line precharge level from changing.

The shut-off controlling circuit 300 controls a gate voltage of the shut-off circuit 200 to compensate for the change of the bit-line precharge level as a function of temperature. An embodiment of the shut-off controlling circuit 300 is shown in detail with reference to FIG. 2 and described later.

Figure 2:
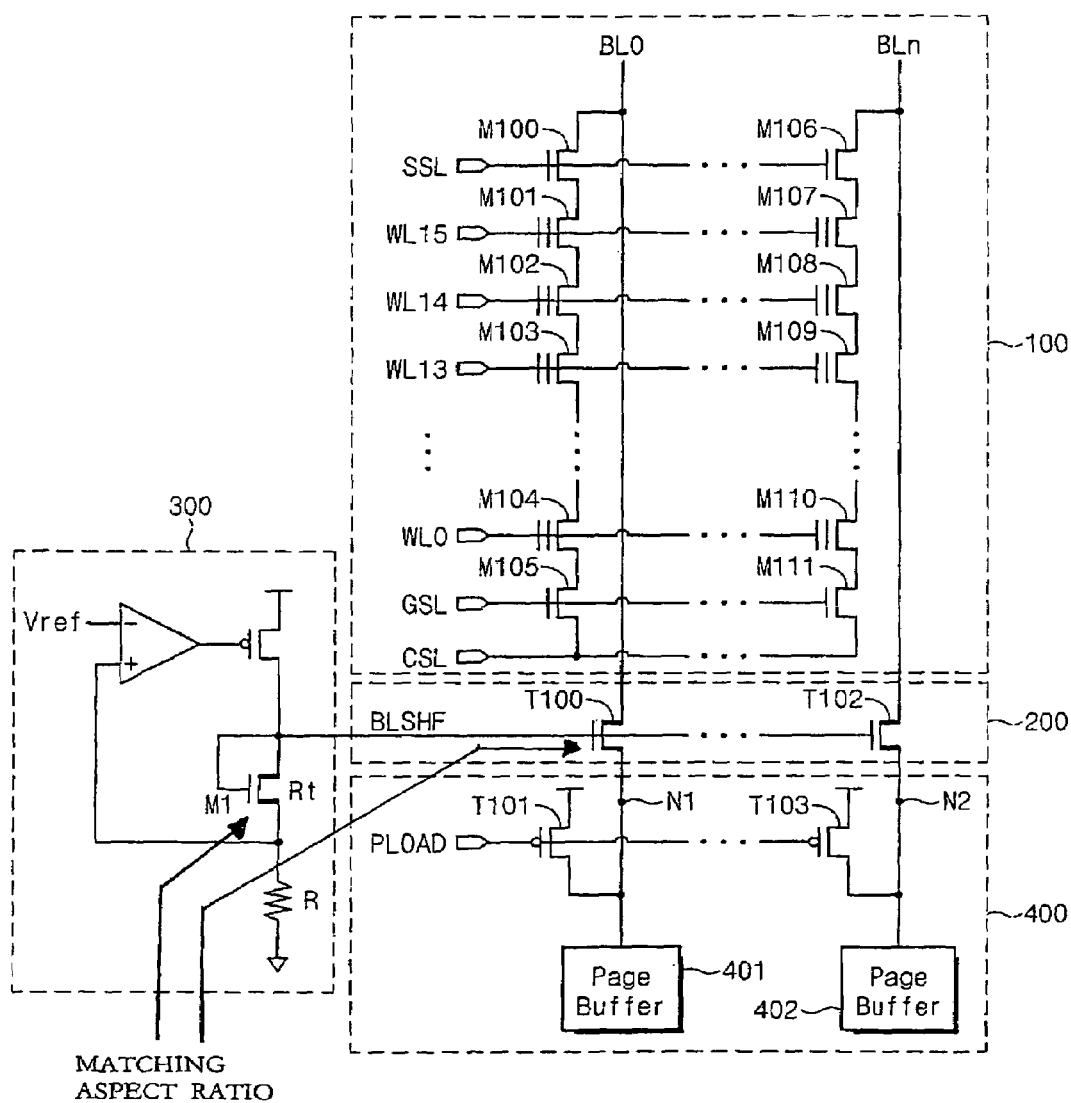
FIG. 2 is a circuit illustrating a nonvolatile semiconductor memory device according to a preferred embodiment of the present invention.

FIG. 2 is a circuit diagram illustrating a non-volatile semiconductor memory device according to a preferred embodiment of the present invention.

The inventive nonvolatile semiconductor memory device includes the memory cell array 100, the shut-off transistor 200, the shut-off controlling circuit 300, and the bit line voltage supplying circuit 400 having page buffers 401 and 402.

The memory cell array 100 has an overall structure of a plurality of word lines, WL0, . . . , WL15, and a plurality of bit lines, BL0, . . . , BLn, arranged in a matrix. Further, the memory cell array 100 has a basic structure of a string selection transistor M100, a ground selection transistor M105, and the memory cells M101, . . . , M104 serially connected therebetween for bit line BL0. This basic structure is called a "string". Similar structure exists for all other bit lines as well; for bit line BTn, the string selection transistor and the ground selection transistor are aiven by M106 and M111 respectively and the memory cells given by M107, . . . , M110. The gates of the memory cells are connected to the word lines. A group of the memory cells commonly connected on the same word line is called a "page". The plurality of strings in parallel, respectively connected to the bit lines, is also connected to a common source line (CSL), thereby forming a block.

In FIG. 2, if the reading operation is performed for memory cell M104, 0V is applied to word line WL0, and $V_{read}$ (about 4.5V) is applied to word lines WL1 to WL15, a string select line SSL, and a ground select line GSL. When the word line voltage is applied in a precharged state of the bit line, the bit-line precharge level drops if the memory cell M104 is an erased cell, and the bit-line precharge level is maintained if the memory cell M104 is a programmed cell. As such, the bit-line precharge level is differentiated depending on the state of the memory cell. This is called "bit line (BL) develop".

The shut-off transistor T100 is connected between a bit line BL0 and a sense node N1, and functions to electrically disconnect or connect the bit line BL0 and the sense node N1. Similar shutoff transistor exists for other bit lines as well; for example, shut off transistor T102 is connected between a bit line BLn and the sense node N2. The shut-off transistor T100 is an NMOS transistor. The NMOS transistor has a drain tenninal connected to the sense node N1, a source terminal connected to the bit line BL0, and a gate terminal connected to the shut-off controlling circuit 300.

The precharge level of the bit line BL0 is determined using a gate voltage BLSHF, also called $V_G$, and a threshold voltage $V_{TH}$ by the shut-off characteristic of the shut-off transistor T100. If the gate voltage BLSHF is applied to the gate terminal of the shut-off transistor T100, and the power supply Vcc is applied to the drain terminal at N1, the bit line BL0 is precharged until the shut-off transistor T100 is shut off. When the shut-off transistor T100 is shut off, the precharge level of the bit line is expressed as BLSHF–$V_{TH}$.

As described above, the transistor's threshold voltage changes with changing temperature. If the temperature rises, the threshold voltage of the transistor drops, and if the temperature drops, the threshold voltage of the transistor rises. This means that the precharge level of the bit line BL0 will vary depending on the temperature.

The shut-off controlling circuit 300 controls the gate voltage BLSHF of the shut off transistor T100 to compensate the precharge level of the bit line BL0 such that the precharge level is maintained constant regardless of the temperature change.

In FIG. 2, the shut-off controlling circuit 300 includes a power generator for generating the power supply, and a voltage divider for dividing the voltage generated in the power generator. The voltage divider includes a fixed resistance R and a variable resistance Rt having a resistance that is a function of temperature. The variable resistance is comprised of the NMOS transistor M1 having the same aspect ratio (W/L) as the shut-off transistor T100. Transistor M1 is designed to match the temperature characteristics of the shut-off transistors. As an output voltage of the shut-off controlling circuit 300, the voltage BLSHF is a a function of the resistor R and the resistor Rt of the NMOS transistor M1, as follows.

From a voltage divider rule, we have the equation $$Vref = \frac{R}{Rt + R} BLSHF.$$

This can be expressed as $$BLSHF = \left(1 + \frac{Rt}{R}\right) Vref.$$

In the above equation, the value of the resistor Rt of the NMOS transistor M1 is proportional to the threshold voltage ($V_{TH}$). That is, if the threshold voltage $V_{TH}$ of the NMOS transistor M1 changes with changing temperature then the resistance component Rt also correspondingly changes. If the temperature rises, the threshold voltage decreases, thereby decreasing the resistance component Rt. And if the temperature decreases, the threshold voltage rises, thereby increasing the resistance value Rt. Accordingly, the voltage BLSHF, being the output voltage of the shut-off controlling circuit 300, varies as a function of temperature. That is, if the temperature rises, the voltage BLSHF decreases, and if the temperature decreases, the voltage BLSHF rises.

Accordingly, the precharge level (BLSHF–$V_{TH}$) of the bit line is maintained since the voltage BLSHF also decreases in proportion to the threshold voltage $V_{TH}$ of the shut-off transistor 200, which decreases with a temperature increase.

The page buffer 401 supplies the power supply Vcc and the ground voltage GND to the sense node N1.

Figures 3A, 3B:
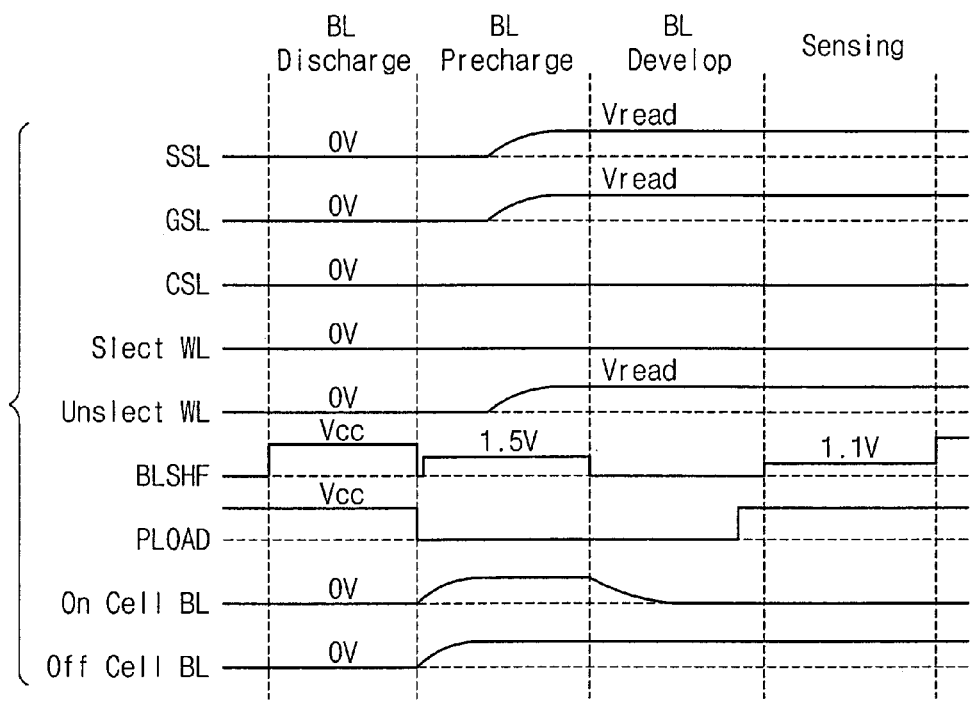
FIG. 3A is a timing diagram illustrating a reading operation of a nonvolatile semiconductor memory device according to a preferred embodiment of the present invention.
FIG. 3B illustrates a voltage applied to a word line at the time of a reading operation of FIG. 3A.

FIG. 3A is a timing diagram illustrating a reading operation of the nonvolatile semiconductor memory device according to a preferred embodiment of the present invention. FIG. 3B illustrates a voltage applied to the selection and non-selection word lines, the string select line (SSL), the ground select line (GSL), and the common source line (CSL), at the time of the reading operation.

The shut-off controlling circuit 300 varies the output voltage BLSHF depending on the temperature. For description convenience, FIG. 3A illustrates BLSHF as a constant value (for example, 1.5V), but this value, in general, varies depending on the temperature. A circuit PLOAD couples the power supply Vcc to the sense node N1. In the bit line precharge step, if 0V is applied to the circuit PLOAD to turn on a PMOS transistor T101, the power supply Vcc is supplied to the sense node N1. At this time, the voltage BLSHF, a function of temperature, is applied to the gate of the shut-off transistor T100. The bit-line precharge level rises until the shut-off transistor T100 is shut off, and BLSHF–$V_{TH}$ is finally obtained.

At this time, if the selected memory cell is an on cell (erased cell), the bit-line precharge level drops. However, if the selected memory cell is an off cell (programmed cell), the bit-line precharge level is maintained. Through this reading operation, it is sensed whether the memory cell is an erased cell or a programmed cell.

Figure 4:
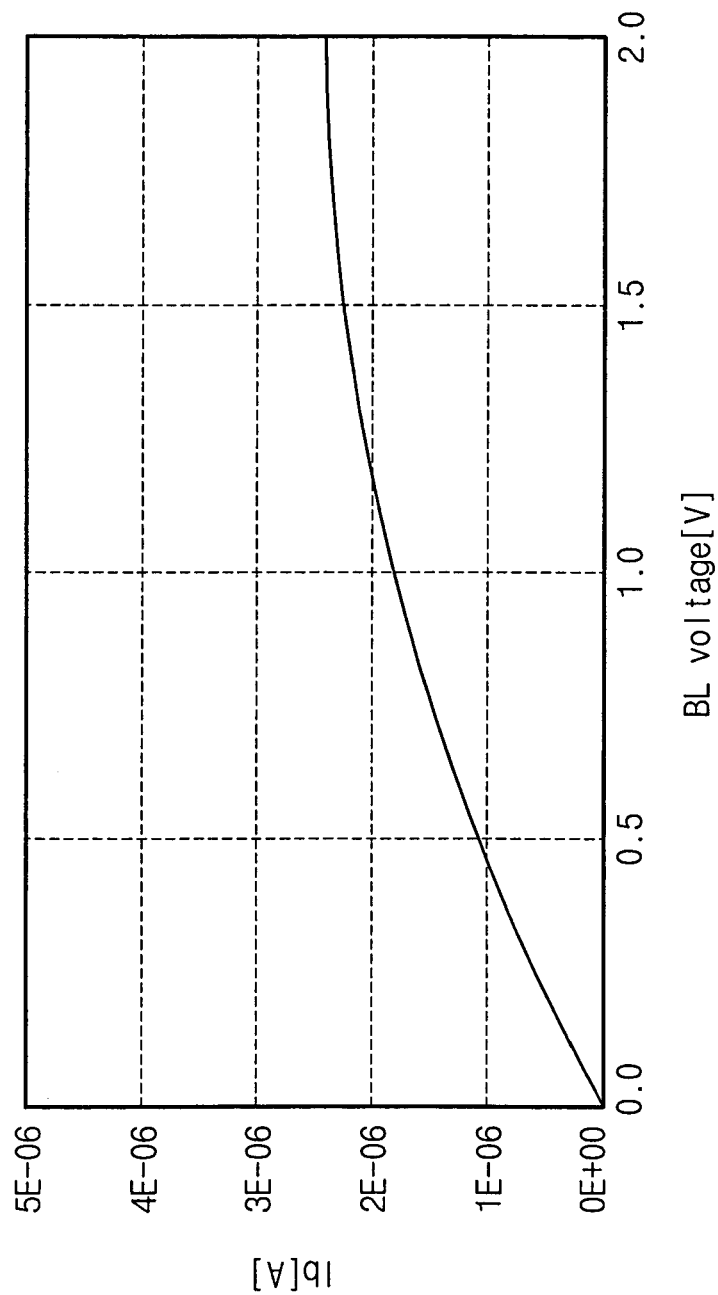
FIG. 4 is a graph illustrating the variation of memory cell current as a function of bit-line precharge level.

FIG. 4 is a graph illustrating a current flowing through the memory cell (hereinafter, referred to as "cell current") depending on the bit-line precharge level.

Referring to FIG. 4, the cell current is a function of the bit-line precharge level. This characteristic affects a sense gain, specifically when the selected memory cell is an on cell (erased cell). That is, the memory cell sensed as the erased cell in a high temperature may be sensed as the off cell (programmed cell) in a low temperature. This phenomenon can be caused when the bit line voltage level changes with changing temperature. An embodiment of the present invention may prevent the bit-line precharge level from changing with respect to changing temperature.

Figure 5A:
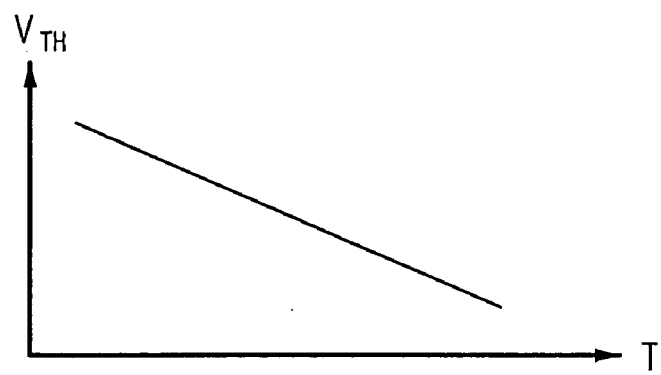
FIG. 5A is a graph illustrating a variation of a threshold voltage as a function of temperature.

FIG. 5A is a graph illustrating the change of the threshold voltage as a function of temperature.

Generally, the threshold voltage of the transistor drops by about 2 mV as the temperature rises by 1° C. This causes the bit-line precharge level to change as a function of temperature. That is, the bit-line precharge level becomes BLSHF–$V_{TH}$. Since the $V_{TH}$ varies depending on the temperature, the bit-line precharge level also varies.

Figure 5B:
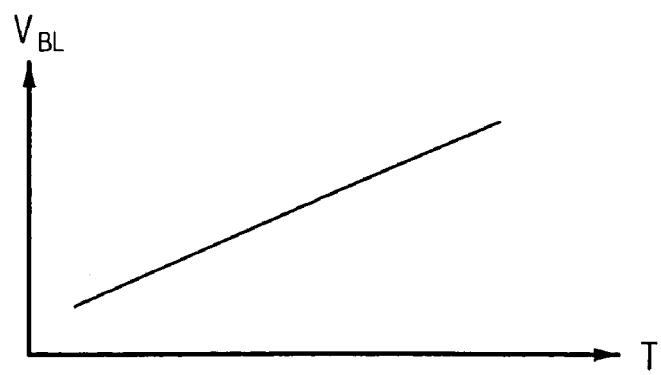
FIG. 5B is a graph illustrating bit line level as a function of temperature.

FIG. 5B is a graph illustrating the bit line level as a function of temperature in the case that the gate voltage of the shut-off transistor 200 is constant.

Referring to FIG. 5B, the bit-line precharge level (BLSHF–$V_{TH}$) rises as the temperature rises. As described in FIG. 5A, this is because as the temperature rises, the threshold voltage $V_{TH}$ constantly drops.

Figure 5C:
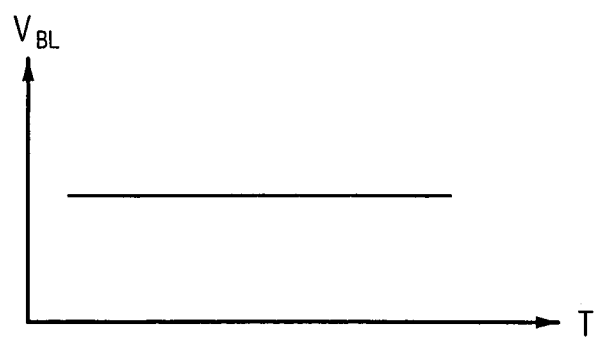
FIG. 5C is a graph illustrating compensated bit-line precharge level as a function of temperature according to a preferred embodiment of the present invention.

FIG. 5C is a graph illustrating the change of the bit-line precharge level as a function of temperature in the case that the gate voltage of the shut-off transistor 200 is varied. Even as the temperature rises, since the gate voltage of the shut-off transistor 200 decreases as much as the threshold voltage of the shut-off transistor 200 decreases, the bit-line precharge level is constantly maintained. FIG. 5C illustrates the bit-line precharge level according to the present innvention.

Figure 6:
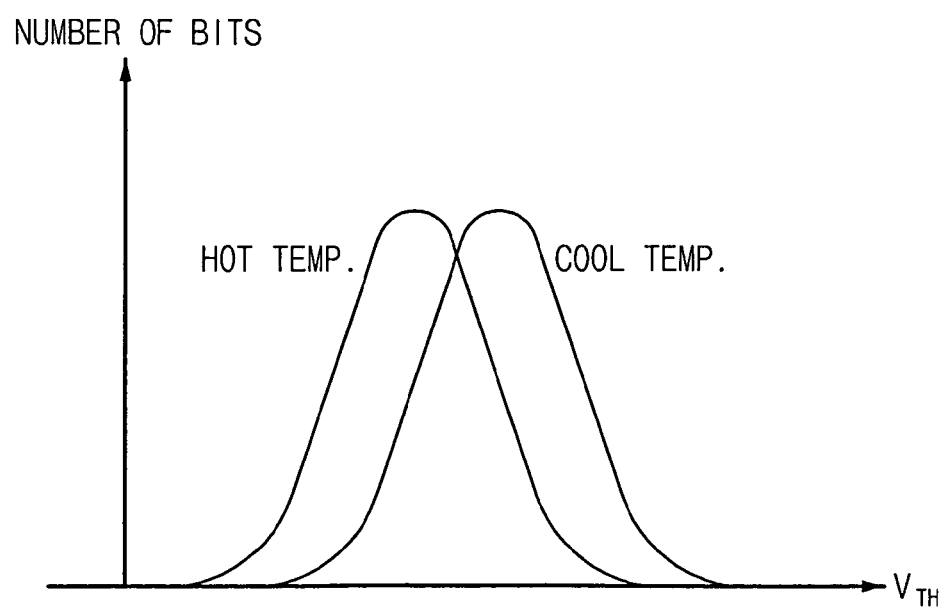
FIG. 6 is a scatter plot of a memory cell illustrating the dependence on temperature.
Figure 7:
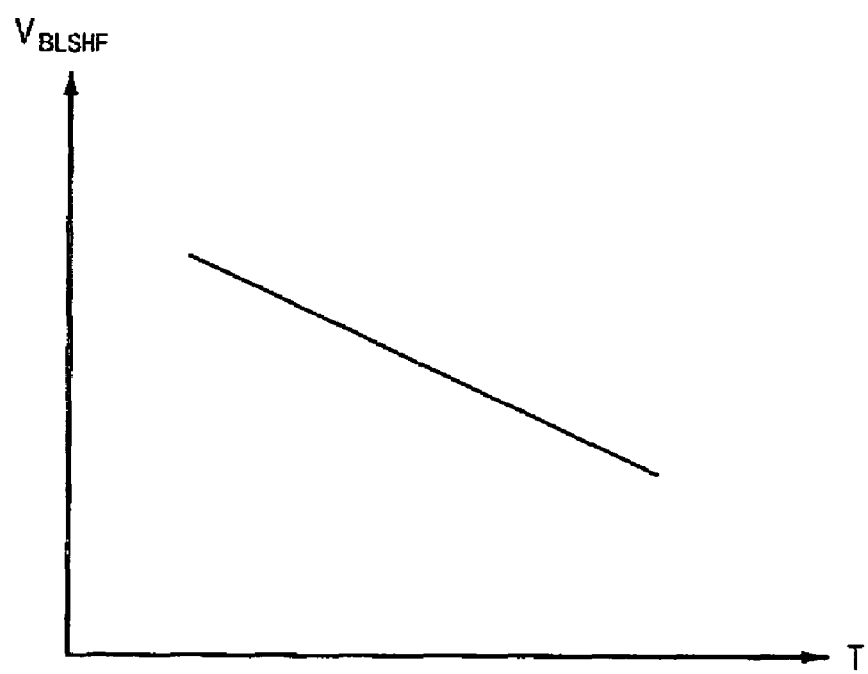
FIG. 7 is a graph illustratine a variation of a sate voltage of a shut-off transistor as a function of temperature according to a preferred embodiment of the present invention.

FIG. 6 is a scatter plot of the NUMBER OF BITS versus threshold voltage $V_{TH}$ of memory cells illustrating the dependence on the temperature. If the temperature rises, the threshold voltage drops (shown by the curve 'HOT TEMP.'), and if the temperature drops, the threshold voltage rises (shown by the curve 'COOL TEMP.'). Accordingly, the scatter plot of the memory cell varies depending on the temperature change. This causes an on (erased) memory cell to be sensed as an off cell (programmed cell). The present invention solves this drawback by varying the threshold voltage of the shut-off transistor 200 depending on the temperature as shown in FIG. 6.

It will be apparent to those skilled in the art that various modifications and variations can be made in the present invention. For example, the term gate refers not only to the gate of an FET transistor, but also to the control terminal of any other current controlling transistor or device. Thus, it is intended that the present invention covers the modifications and variations of this invention provided they come within the scope of the appended claims and their equivalents.

The invention claimed is:

1. A nonvolatile semiconductor memory device, comprising:
    an electrically programmable memory cell array connected to a plurality of word lines and a plurality of bit lines;
    a bit line voltage supplying circuit to supply a bit line voltage to the bit lines;
    a shut-off circuit connected between the memory cell array and the bit line voltage supplying circuit, to electrically disconnect or connect the bit lines and the bit line voltage supplying circuit during a precharge operation; and
    a shut-off controlling circuit to control the shut off circuit, wherein the shut-off controlling circuit is constructed to compensate a bit-line precharge level for a reading operation depending on temperature.

2. The nonvolatile semiconductor memory device of claim 1, wherein the shut-off circuit comprises an NMOS transistor having a gate terminal connected to the shut-off controlling circuit, a drain terminal connected to the bit line voltage supplying circuit, and a source terminal connected to the bit line.

3. The nonvolatile semiconductor memory device of claim 2, wherein in the shut-off controlling circuit, an input voltage to the gate terminal drops if the temperature rises, and the input voltage to the gate terminal rises if the temperature drops.

4. The nonvolatile semiconductor memory device of claim 1, wherein the shut-off controlling circuit comprises:
    a power generator for generating a power supply; and
    a voltage divider for dividing a voltage generated from the power generator, wherein the voltage divider has a fixed resistance and a variable resistance having a resistance that is a function of the temperature.

5. The nonvolatile semiconductor memory device of claim 4, wherein the variable resistance comprises an NMOS transistor.

6. The nonvolatile semiconductor memory device of claim 1, wherein the shut-off circuit and the shut-off controlling circuit comprise transistors having matching temperature characteristics.

7. The nonvolatile semiconductor memory device of claim 6, wherein the matching temperature characteristics include matching threshold voltages.

8. The nonvolatile semiconductor memory device of claim 1, wherein the shut-off circuit and the shut-off controlling circuit comprise transistors having matching aspect ratios.

9. A nonvolatile semiconductor memory device, comprising:
    an electrically programmable memory cell array connected to a plurality of word lines and a plurality of bit lines;
    means for supplying a bit line voltage to the bit lines;
    means for electrically disconnecting or connecting the bit lines and a bit line voltage supplying circuit during a precharge operation; and
    means for controlling the means for electrically disconnecting or connecting, wherein the means for controlling is constructed to compensate a bit-line precharge level for a reading operation depending on temperature.

10. The nonvolatile semiconductor memory device of claim 9, wherein the means for electrically disconnecting or connecting comprises an NMOS transistor having a gate voltage.

11. The nonvolatile semiconductor memory device of claim 9, wherein the means for controlling is constructed such that the gate voltage drops if the temperature rises, and the gate voltage rises if the temperature drops.

12. The nonvolatile semiconductor memory device of claim 9, wherein the means for controlling comprises:
    means for generating a power supply voltage; and
    means for dividing the power supply voltage.

13. The nonvolatile semiconductor memory device of claim 12 wherein the means for dividing comprises a tixed resistance and a variable resistance having a resistance that is a function of temperature.

14. The nonvolatile semiconductor memory device of claim 13, wherein the variable resistance is an NMOS transistor.

15. The nonvolatile semiconductor memory device of claim 13 wherein the means for electrically disconnecting or connecting and the means for controlling comprise transistors having matching temperature characteristics.

16. A method of operating a nonvolatile semiconductor memory device comprising:
    coupling a bit line to a sense node responsive to a gate voltage; and
    temperature compensating the gate voltage during a bit-line precharge prior to a bit-line sense operation.

17. The method of claim 16 wherein coupling a bit line to a sense node responsive to a gate voltage comprises coupling a bit line to a sense node through a first transistor that is controlled by the gate voltage.

18. The method of claim 17 wherein temperature compensating the gate voltage comprises generating the gate voltage responsive to a second transistor having a temperature characteristic that matches the temperature characteristic of the first transistor.

19. The method of claim 18 wherein the second transistor is arranged in a voltage divider.

* * * * *

UNITED STATES PATENT AND TRADEMARK OFFICE
CERTIFICATE OF CORRECTION

PATENT NO. : 7,257,028 B2  Page 1 of 1
APPLICATION NO. : 10/884152
DATED : August 14, 2007
INVENTOR(S) : Kyeong-Han Lee et al.

It is certified that error appears in the above-identified patent and that said Letters Patent is hereby corrected as shown below:

Column 1, line 58, the words "V read" should read -- Vread --;
Column 4, line 65, the word "tenninal" should read -- terminal --;
Column 6, line 65, the word "innvention" should read -- invention --;
Column 8, line 31, the word "tixed" should read -- fixed --.

Signed and Sealed this

Fifth Day of August, 2008

JON W. DUDAS
*Director of the United States Patent and Trademark Office*